US012740478B2

(12) United States Patent
Youn et al.

(10) Patent No.: US 12,740,478 B2
(45) Date of Patent: Sep. 15, 2026

(54) SYSTEM ON CHIP HAVING THREE-DIMENSIONAL CHIPLET STRUCTURE AND ELECTRONIC DEVICE INCLUDING THE SYSTEM ON CHIP

(71) Applicant: Samsung Electronics Co., Ltd., Suwon-si (KR)

(72) Inventors: Daehan Youn, Suwon-si (KR); Kyoungmin Lee, Yongin-si (KR); Junho Huh, Yongin-si (KR); Heeseok Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 717 days.

(21) Appl. No.: 17/887,587

(22) Filed: Aug. 15, 2022

(65) Prior Publication Data

US 2023/0107103 A1 Apr. 6, 2023

(30) Foreign Application Priority Data

Sep. 24, 2021 (KR) ........................ 10-2021-0126724

(51) Int. Cl.

| | |
|---|---|
| ***H10W 90/00*** | (2026.01) |
| ***G11C 5/14*** | (2006.01) |
| *H10W 72/00* | (2026.01) |
| *H10W 90/20* | (2026.01) |

(52) U.S. Cl.

CPC ............ *H10W 90/00* (2026.01); *G11C 5/147* (2013.01); *H10W 72/823* (2026.01); (Continued)

(58) Field of Classification Search

CPC ..... H01L 25/18; H01L 25/0652; H01L 25/16; H01L 25/105; H01L 25/0657; (Continued)

(56) References Cited

U.S. PATENT DOCUMENTS

| | | | |
|---|---|---|---|
| 9,101,068 | B2 | 8/2015 | Yun et al. |
| 9,406,648 | B2 | 8/2016 | Wang et al. |

(Continued)

FOREIGN PATENT DOCUMENTS

| | | | |
|---|---|---|---|
| CN | 112687670 | A | 4/2021 |
| KR | 1020160076188 | A | 6/2016 |

(Continued)

OTHER PUBLICATIONS

European Search Report dated May 8, 2023 for corresponding EP Patent Application No. 22193837.6.

(Continued)

*Primary Examiner* — Marlon T Fletcher
*Assistant Examiner* — Christina A Sylvia
(74) *Attorney, Agent, or Firm* — Harness, Dickey & Pierce, P.L.C.

(57) ABSTRACT

Provided are a system on chip (SoC) having a three-dimensional (3D) chiplet structure, and an electronic device including the SoC. The electronic device includes a printed circuit board, the SoC on the printed circuit board, and a memory device on the SoC, wherein the SoC includes an SoC package substrate, a first die arranged on the SoC package substrate, and having a logic circuit thereon, and a second die arranged on the first die, and having a logic circuit thereon.

19 Claims, 14 Drawing Sheets

(52) U.S. Cl.
CPC ........ *H10W 90/291* (2026.01); *H10W 90/722* (2026.01); *H10W 90/724* (2026.01)

(58) Field of Classification Search
CPC . H01L 2225/06513; H01L 2225/06517; H01L 2225/06548; H01L 2225/06586; H01L 2225/06524; H01L 2225/06541; H01L 2225/06565; H01L 2225/06568; H01L 2225/1023; H01L 2225/1041; H01L 2225/1058; H01L 23/49816; H01L 23/49827; H01L 23/5385; H01L 24/19; H01L 24/20; H01L 24/13; H01L 24/16; H01L 24/17; H01L 24/73; H01L 24/92; H01L 2224/13025; H01L 2224/16146; H01L 2224/214; H01L 2224/04105; H01L 2224/12105; H01L 2224/16145; H01L 2224/16227; H01L 2224/17181; H01L 2224/73209; H01L 2224/73259; H01L 2224/92124; H01L 2924/13091; H01L 2924/1431; H01L 2924/1434; H01L 2924/1461; H01L 2924/15192; H01L 2924/15311; H01L 2924/19104; H01L 2924/19105; G11C 5/147; G11C 5/025; H10W 90/00; H10W 72/823; H10W 90/291; H10W 90/722; H10W 90/724; H10W 70/099; H10W 70/63; H10W 72/072; H10W 72/853; H10W 90/28; H10W 70/09; H10W 70/60; H10W 70/611; H10W 70/6528; H10W 72/07254; H10W 72/241; H10W 72/244; H10W 72/247; H10W 90/401; H10W 70/635; H10W 72/874; H10W 72/9413; H10W 90/20; H10W 90/26; H10W 90/297; H10W 90/701; H10W 72/20; H10W 72/851
See application file for complete search history.

(56) References Cited

U.S. PATENT DOCUMENTS

| | | | | |
|---|---|---|---|---|
| 9,595,514 | B2 | 3/2017 | Bruno et al. | |
| 9,935,076 | B1 * | 4/2018 | Ramachandran | H01L 25/16 |
| 10,504,848 | B1 * | 12/2019 | Parto | G06F 1/3287 |
| 10,672,663 | B2 | 6/2020 | DeLaCruz et al. | |
| 10,672,745 | B2 | 6/2020 | Teig et al. | |
| 10,777,502 | B2 | 9/2020 | Wang et al. | |
| 10,827,616 | B2 | 11/2020 | Hattori | |
| 11,004,783 | B2 | 5/2021 | Calugaru | |
| 11,211,371 | B2 | 12/2021 | Yu et al. | |
| 2006/0113653 | A1 | 6/2006 | Xiaoqi et al. | |
| 2016/0218094 | A1 * | 7/2016 | Bruno | H01L 23/13 |
| 2017/0133351 | A1 * | 5/2017 | Su | H01L 23/5389 |
| 2018/0095127 | A1 | 4/2018 | Pappu et al. | |
| 2018/0096735 | A1 * | 4/2018 | Pappu | H01L 25/18 |
| 2019/0035757 | A1 * | 1/2019 | Yu | H01L 23/49811 |
| 2019/0035767 | A1 * | 1/2019 | Yu | H01L 24/16 |
| 2019/0181097 | A1 * | 6/2019 | Cheah | H01L 23/552 |
| 2019/0273065 | A1 * | 9/2019 | Yu | H01L 23/538 |
| 2019/0303042 | A1 * | 10/2019 | Kim | G06F 3/0659 |
| 2019/0304915 | A1 * | 10/2019 | Jain | H01L 23/147 |
| 2019/0356040 | A1 | 11/2019 | Kim et al. | |
| 2020/0168528 | A1 | 5/2020 | Cheah et al. | |
| 2020/0194393 | A1 | 6/2020 | Wu et al. | |
| 2021/0013626 | A1 | 1/2021 | Jang et al. | |
| 2021/0043511 | A1 | 2/2021 | Ramachandran et al. | |
| 2021/0111153 | A1 * | 4/2021 | Lin | H01L 24/19 |
| 2023/0207544 | A1 * | 6/2023 | Loh | H01L 24/16 257/668 |

FOREIGN PATENT DOCUMENTS

| | | |
|---|---|---|
| KR | 1020180114491 A | 10/2018 |
| KR | 1020190105346 A | 9/2019 |
| TW | 201709459 A | 3/2017 |
| WO | WO-2020-176313 A1 | 9/2020 |

OTHER PUBLICATIONS

EESR dated Oct. 2, 2023 for corresponding EP Patent Application No. 22193837.6.
Office Action for Korean Application No. 10-2021-0126724 dated Aug. 1, 2025.
Office Action dated Feb. 11, 2026 issued in corresponding Taiwanese Patent Application No. 111136169.

* cited by examiner

Figure 1:
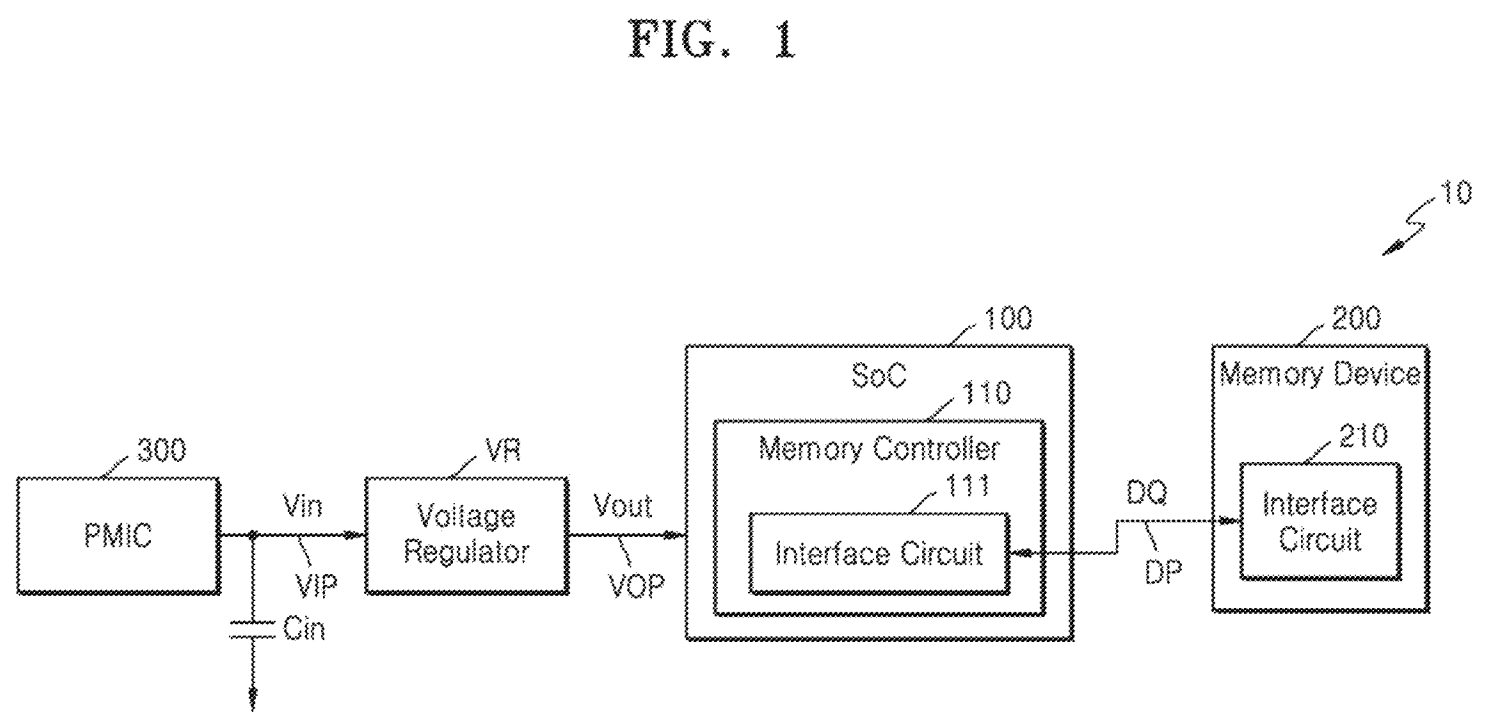

200 Memory Device

210 Interface Circuit

DQ

DP

100 SoC

110 Memory Controller

111 Interface Circuit

Vout

VOP

VR Voltage Regulator

Vin

VIP

Cin

300 PMIC

Memory Device
200
DP'
IM
IS
101
VR
BP3
VOP
BP
VIP
PSUB
BP2
BP1
B
IW
IV
SUB2
ACL2
ACL1
SUB1
DIE2
DIE1
SSUB
100
Cin
SB
PMIC
300

Memory Device
200
IM
IS
SSUB
101
BP2
BP1
VR
VR
IV
SUB2
ACL2
ACL1
SUB1
DIE2
DIE1
100A Memory Device
200
IM
IS
101
VR
BP3
SSUB
BP2
BP1
VR
VR
VR
IVb
SUB2
ACL2
ACL1
SUB1
DIE2
DIE1
100

200
IM
IS
101
VR
BP3
SSUB
BP2
BP1
Memory Device
VR
VR
VR
IVb
SUB2
ACL2
SUB1
ACL1
DIE2
DIE1
100

SYSTEM ON CHIP HAVING THREE-DIMENSIONAL CHIPLET STRUCTURE AND ELECTRONIC DEVICE INCLUDING THE SYSTEM ON CHIP

CROSS-REFERENCE TO RELATED APPLICATION

This application is based on and claims priority under 35 U.S.C. § 119 to Korean Patent Application No. 10-2021-0126724, filed on Sep. 24, 2021 in the Korean Intellectual Property Office, the disclosure of which is incorporated by reference herein in its entirety.

BACKGROUND

The inventive concepts relates to an integrated circuit (IC), and more particularly, to a system on chip having a three-dimensional (3D) chiplet structure and an electronic device including the system on chip.

In the semiconductor industry, demand for high capacity, slimness, and miniaturization of semiconductor elements and electronic products using the semiconductor elements has increased, and various package techniques related thereto are continuously being presented. A semiconductor package of an electronic device is implemented by using IC chips in a form appropriate for use in an electronic product. In general, in the semiconductor package, the semiconductor chips are mounted on a printed circuit board (PCB), and electrically connected to the PCB by using bonding wires or bumps. Due to advancements in the electronic industry, demand for high functionality, high speed, and miniaturization of electronic devices has increased.

SUMMARY

The inventive concepts provides a system on chip (SoC) in which performance is improved, for example, size is reduced, power consumption is reduced, or the like, and an electronic device including the SoC.

According to some example embodiments of the inventive concepts, there is provided an electronic device including a printed circuit board; an SoC arranged on the printed circuit board; and a memory device on the SoC, wherein the SoC includes an SoC package substrate; a first die on the SoC package substrate, and having a logic circuit thereon; and a second die on the first die, and having a logic circuit thereon.

According to some example embodiments of the inventive concepts, there is provided an electronic device including a printed circuit board; an SoC on the printed circuit board, and including at least one logic die having a logic circuit thereon; a memory device on the SoC; and an interconnection via vertically extending in a direction from the at least one logic die to the memory device to electrically connect the at least one logic die to the memory device.

According to some example embodiments of the inventive concepts, there is provided an SoC having a three-dimensional (3D) chiplet structure, the SoC including an SoC package substrate; a first die on the SoC package substrate by using a first bump, and having a first logic circuit thereon; and a second die on the first die, and having a second logic circuit thereon, wherein the first logic circuit and the second logic circuit receive an output voltage via an output voltage path, from a voltage regulator on the SoC package substrate, and a plurality of function blocks are on at least one of the first die and the second die.

BRIEF DESCRIPTION OF THE DRAWINGS

Embodiments of the inventive concepts will be more clearly understood from the following detailed description taken in conjunction with the accompanying drawings in which:

FIGS. 1 and 2 are block diagrams of electronic devices according to example embodiments;

FIG. 3A is a cross-sectional view of an electronic device according to some example embodiments;

FIG. 4A is a cross-sectional view of an electronic device according to some example embodiments;

DETAILED DESCRIPTION OF THE EMBODIMENTS

Hereinafter, various embodiments of the inventive concepts are described in conjunction with the accompanying drawings.

Figure 2:
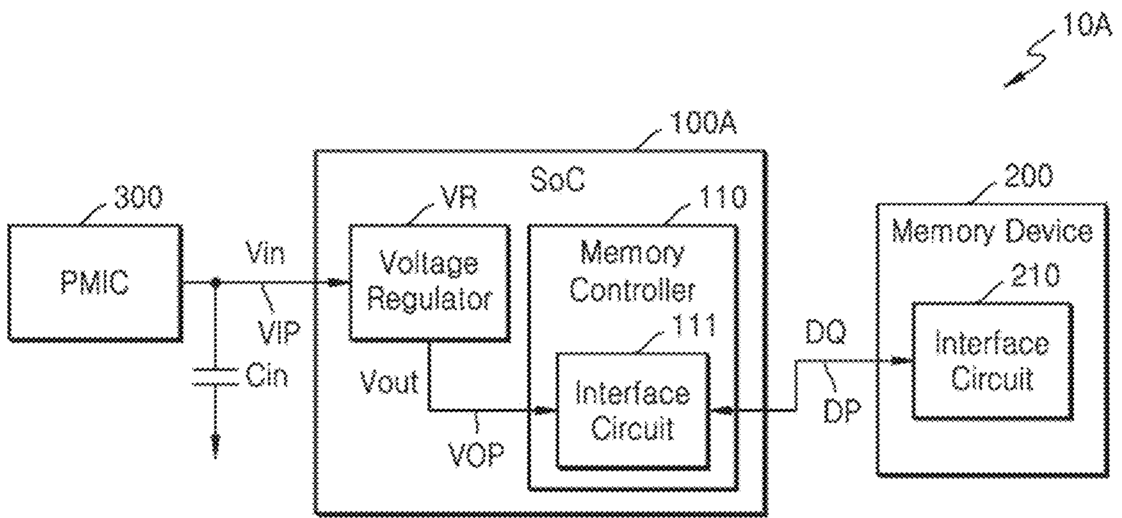

FIGS. 1 and 2 are block diagrams of electronic devices 10 and 10A according to example embodiments, respectively.

Referring to FIG. 1, an electronic device 10 may include a system on chip (SoC) 100, a memory device 200, a power management integrated circuit (PMIC) 300, and a voltage regulator VR. The electronic device 10 may include a smartphone, a smart watch, a personal digital assistant, a digital video camera, a digital still camera, a network system, a computer, a monitor, a tablet, a laptop, a netbook, a television, a video game, an automotive, etc. However, the example embodiments are not limited thereto, and in addition, the electronic device 10 may also include an arbitrary electronic device, which processes data.

The PMIC 300 may provide an input voltage Vin to the voltage regulator VR via an input voltage path VIP. A capacitor Cin may be connected to the input voltage path VIP so that the input voltage Vin is stably provided to the voltage regulator VR by the PMIC 300. For example, the PMIC 300 may include a direct current (DC)-DC converter such as a buck converter, a boost converter, and a buck-boost converter.

The voltage regulator VR may receive the input voltage Vin, and generate an output voltage Vout to be used for an operation of the SoC 100. The voltage regulator VR may provide the output voltage Vout to the SoC 100 via an output voltage path VOP. For example, the output voltage Vout may be provided to a memory controller 110 of the SoC 100.

The voltage regulator VR may include a DC linear regulator such as a low-dropout (LDO) regulator, and a high bandwidth regulator. The output voltage Vout is illustrated as one voltage in FIG. 1, but may include more than one voltages.

The SoC 100 may execute applications supported by the electronic device 10 by using the memory device 200. The SoC 100 may also be referred to as a host, an application processor (AP), etc. The SoC 100 may control the memory device 200, and include the memory controller 110 performing data input/output, together with the memory device 200. For example, the memory controller 110 may approach the memory device 200 in a direct memory access (DMA) method.

The memory controller 110 may include an interface circuit 111 electrically connected to an interface circuit 210 of the memory device 200. The interface circuit 111 of the memory controller 110 may transmit a data input/output signal DQ to the memory device 200 or receive the data input/output signal DQ from the memory device 200 via a signal path DP, and that is, the signal path DP may include a data path. Alternatively, the interface circuit 111 may transmit, to the memory device 200 via the signal path DP, at least one of a command (for example, CDD in FIG. 11), an address (for example, ADD in FIG. 11), a clock (for example, CK in FIG. 11), and other control signals.

The SoC 100 may further include a processor, or the like, in addition to the memory controller 110. A detailed example configuration of the SoC 100 is described below with reference to FIG. 11.

In some example embodiments, the voltage regulator VR may be mounted on an SoC package substrate of the SoC 100. Accordingly, in the electronic device 10 according to the inventive concepts, the number of capacitors for compensating for a voltage drop (or an IR drop) of the output voltage path VOP may be reduced, and the number of bumps electrically connecting the SoC 100 to a printed circuit board may be reduced.

The memory device 200 may receive the data input/output signal DQ, or transmit the input/output signal DQ, via the signal path DP, and may receive a command CMD, an address ADD, a clock CK, or other control signals. For example, the memory device 200 may include a volatile memory element such as a dynamic random-access memory (RAM) (DRAM) element and a static RAM (SRAM) element, and a non-volatile memory element such as a phase-change RAM (PRAM) element, a magnetoresistive RAM (MRAM) element, a ferroelectric RAM (FeRAM) element, and a resistive RAM (RRAM) element. For example, the memory device 200 may include a high bandwidth memory (HBM) DRAM element. A detailed example configuration of the memory device 200 is described below with reference to FIG. 10.

In some example embodiments, each of the SoC 100 and the memory device 200 may constitute a semiconductor package, and the electronic device 10 may have a package on package (PoP) structure, in which the memory device 200 is arranged on the SoC 100.

Referring to FIG. 2, compared to the electronic device 10 of FIG. 1, an electronic device 10A may include an SoC 100A including the voltage regulator VR. In some example embodiments, the SoC 100A may include a plurality of vertically stacked dies, and the voltage regulator VR may be formed on at least one of the plurality of dies included in the SoC 100A. Accordingly, in the electronic device 10A according to the inventive concepts, the number of capacitors for compensating for a voltage drop (or an IR drop) of the output voltage path VOP may be reduced, and the number of bumps electrically connecting the SoC 100A to a printed circuit board may be reduced.

Figure 3A:
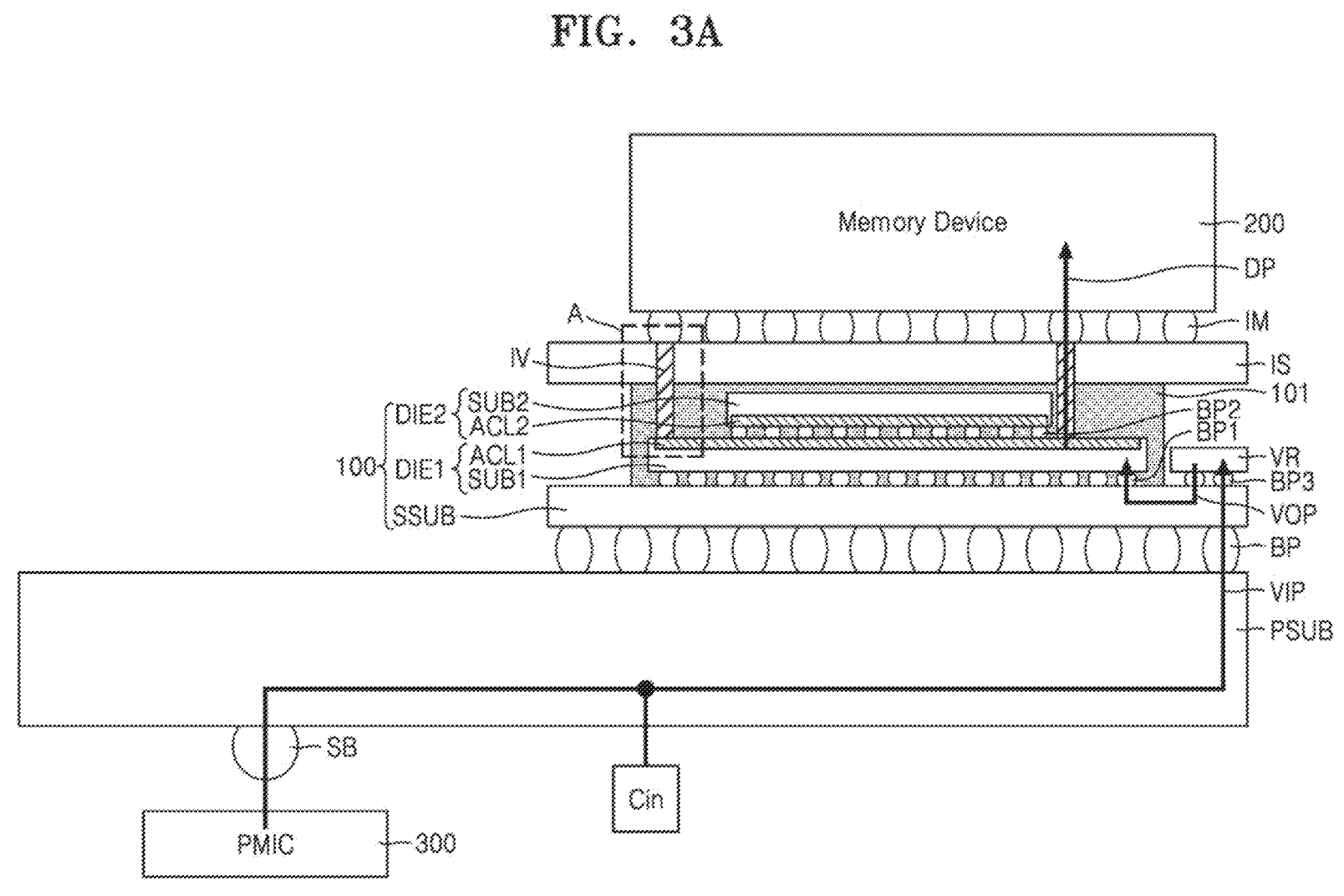
Figure 3B:
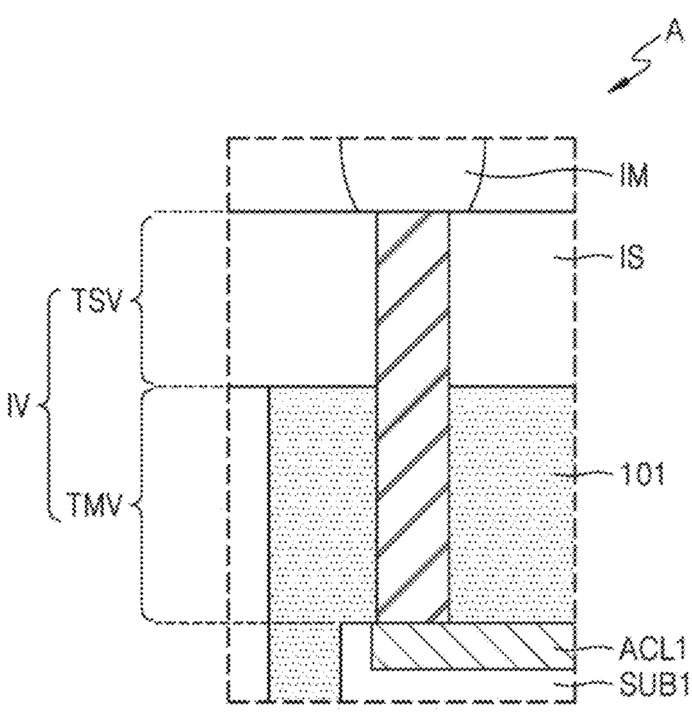
FIG. 3B is an enlarged cross-sectional view of a region A in FIG. 3A.

FIG. 3A is a cross-sectional view of an electronic device according to some example embodiments. FIG. 3B is an enlarged cross-sectional view of a region A in FIG. 3A.

Referring to FIG. 3A, an electronic device (for example, 10 of FIG. 1) may include a printed circuit board PSUB, and the SoC 100 and the memory device 200 may be provided on the printed circuit board PSUB. Each of the SoC 100 and the memory device 200 may be implemented as a semiconductor package, and may be provided on the printed circuit board PSUB, as a semiconductor package of a PoP type.

The printed circuit board PSUB may be electrically connected to a mother board via an external connection terminal SB, and may be electrically connected to the PMIC 300 and the capacitor Cin. The external connection terminal SB may include, for example, a solder ball or a solder bump. In FIG. 3A, the capacitor Cin is illustrated as being electrically connected to the printed circuit board PSUB outside the printed circuit board PSUB, but the example embodiments are not limited thereto, and the capacitor Cin may also be formed inside the printed circuit board PSUB.

The printed circuit board PSUB may include connection wirings and vias therein. The printed circuit board PSUB may provide the connection wirings and the vias included in the input voltage path VIP, and may electrically connect the PMIC 300 to the voltage regulator VR. Each of the connection wirings and the vias may include a metal material such as tungsten (W), copper (Cu), titanium (Ti), tantalum (Ta), ruthenium (Ru), manganese (Mn), and cobalt (Co), nitride or oxide of a metal such as Ti, Ta, Ru, Mn, Co, and W, cobalt tungsten phosphide (CoWP), cobalt tungsten boron (CoWB), cobalt tungsten boron phosphide (CoWBP), or a combination thereof.

The printed circuit board PSUB may include a wiring insulating layer surrounding the connection wirings and the vias, and may include at least one of silicon oxide (SiO), silicon nitride (SiN), silicon carbide nitride (SiCN), silicon oxy carbide (SiOC), a polymer material, and an insulation material having a lower permittivity than SiO.

The SoC 100 may include an SoC package substrate SSUB, and at least one logic die mounted on the SoC package substrate SSUB, for example, a first die DIE1 and a second die DIE2. The SoC package substrate SSUB may be electrically connected to the printed circuit board PSUB via internal connection terminals BP.

A plurality of logic dies may be stacked on the SoC package substrate SSUB in a direction vertical to a main surface of the SoC package substrate SSUB. For example, the second die DIE2 may be arranged on the first die DIE1, the first die DIE1 may be electrically connected to the SoC package substrate SSUB via a first bump BP1, and the second die DIE2 may be electrically connected to the first die DIE1 and the SoC package substrate SSUB via a second bump BP2. In FIG. 3A, an example is illustrated in which two logic dies, that is, the first die DIE1 and the second die DIE2, are sequentially stacked on the SoC package substrate SSUB, but the electronic device 10 according to the inventive concepts are not limited thereto, and three or more logic dies may also be sequentially stacked on the SoC package substrate SSUB.

When the SoC 100 includes a plurality of vertically stacked logic dies, an area occupied by the SoC 100 on the printed circuit board PSUB, that is, a platform form factor, may be reduced. In addition, the number of the internal connection terminals BP electrically connecting the SoC 100 to the printed circuit board PSUB may be reduced.

Logic circuits included in the SoC 100 may be implemented on the first die DIE1 and the second die DIE2, and a plurality of intellectual properties (IP) may be implemented. For example, each component of the SoC 1000 described with reference to FIG. 11 may be implemented on the first die DIE1 and the second die DIE2. For example, the first die DIE1 and the second die DIE2 may include a processor and a memory controller (for example, 110 in FIG. 1).

The first die DIE1 may include a first substrate SUB1 and a first active layer ACL1. First logic circuits may be formed on the first active layer ACL1. For example, the first active layer ACL1 may include a plurality of first semiconductor elements, and wiring layers on the plurality of first semiconductor elements.

The second die DIE2 may include a second substrate SUB2 and a second active layer ACL2. Second logic circuits may be formed on the second active layer ACL2. For example, the second active layer ACL2 may include a plurality of second semiconductor elements formed on the second substrate SUB2, and wiring layers on the plurality of second semiconductor elements. The wiring layers of each of the first active layer ACL1 and the second active layer ACL2 may include metal wiring layers and via plugs.

Each of the first substrate SUB1 and the second substrate SUB2 may include, for example, silicon (Si). Alternatively, each of the first substrate SUB1 and the second substrate SUB2 may include a semiconductor element such as germanium (Ge), or a compound semiconductor such as silicon carbide (SiC), gallium arsenide (GaAs), indium arsenide (InAs), and indium phosphide (InP).

The first semiconductor elements formed on the first active layer ACL1 and the second semiconductor elements formed on the second active layer ACL2 may include microelectronic elements, for example, a metal-oxide-semiconductor field effect transistor (MOSFET), a system large scale integration (LSI), an image sensor such as a complementary metal-oxide semiconductor (CMOS) imaging sensor (CIS), a micro-electro-mechanical system (MEMS), an active element, a passive element, etc.

In some example embodiments, the first active layer ACL1 of the first die DIE1 and the second active layer ACL2 of the second die DIE2 may be arranged face to face. In addition, in some example embodiments, a size of the first die DIE1, which is arranged relatively closer to the SoC package substrate S SUB, may be greater than a size of the second die DIE2.

The SoC 100 may include a molding layer 101 surrounding the first die DIE1 and the second die DIE2. The molding layer 101 may protect the first die DIE1 and the second die DIE2 from external influences such as impacts and contamination. To perform the protection, the molding layer 101 may include an epoxy mold compound, or resin, etc. In addition, the molding layer 101 may be formed by a process such as compression molding, lamination, screen printing, etc. However, even though the molding layer 101 is illustrated as not surrounding the voltage regulator VR in FIG. 3A, the example embodiments are not limited thereto, and the molding layer 101 may also be formed to surround the voltage regulator VR.

In some example embodiments, the voltage regulator VR may include an integrated voltage regulator IVR, which is mounted on the SoC package substrate S SUB. In other words, the first die DIE1 and the voltage regulator VR may be arranged in parallel with each other on a same flat surface. The voltage regulator VR may be electrically connected to the SoC package substrate SSUB via a third bump BP3. The SoC package substrate SSUB may provide the connection wirings and the vias included in the input voltage path VIP of the voltage regulator VR, and in addition, may provide connection wirings and vias included in the output voltage path VOP of the voltage regulator VR. Even though the voltage regulator VR is illustrated as arranged on the right side of the first die DIE1 as a reference in FIG. 3A, the example embodiments are not limited thereto, and the voltage regulator VR may also be arranged on the left side of the first die DIE1 as a reference.

In the electronic device 10 according to the inventive concepts, by including the voltage regulator VR mounted on the SoC package substrate S SUB, the total length of the output voltage path VOP of the voltage regulator VR may be shortened. For example, when it is assumed that the voltage regulator VR is connected to an external connection terminal SB of the printed circuit substrate PSUB according to a comparison example, voltage transfer lines inside the printed circuit board PSUB may be formed so that the output voltage Vout is transferred to the SoC 100, and due to lengths of the voltage transfer lines, a voltage drop (or IR drop) may occur. Accordingly, in the electronic device 10 according to the inventive concepts, by including the voltage regulator VR mounted on the SoC package substrate SSUB, an area for forming the output voltage path VOP may be reduced, and the number of capacitors for compensating for a voltage drop of the output voltage path VOP may be reduced.

An interposer substrate IS may include a redistribution substrate, and may be configured to electrically connect the SoC 100 to the memory device 200. Wiring layers and vias connecting the wiring layers to each other may be formed in the interposer substrate IS. A first surface of the interposer substrate IS may face the SoC 100, and a second surface facing the first surface of the interposer substrate IS may face the memory device 200.

The memory device 200 may be arranged on the interposer substrate IS, and may be electrically connected to the interposer substrate IS via an interconnection terminal IM. The memory device 200 may have a structure in which a plurality of memory dies are stacked. For example, the memory device 200 may have a structure in which the plurality of memory dies are stacked on a buffer die.

Referring to FIGS. 3A and 3B, the SoC 100 may transmit at least one of a data input/output signal (for example, DQ in FIG. 1), control signals, and a clock to the memory device 200 via an interconnection via IV. In other words, the signal path DP may include the interconnection via IV.

In some example embodiments, the interconnection via IV may include a through silicon via (TSV) penetrating the interposer substrate IS, and a through mold via (TMV) penetrating the molding layer 101.

In some example embodiments, an interface circuit (for example, 111 in FIG. 1) included in a memory controller (for example, 110 in FIG. 1) of the SoC 100 may be formed on the first active layer ACL1 of the first die DIE1. The interconnection via IV may be formed to extend from the first active layer ACL1 to the interconnection terminal IM in a vertical direction, to electrically connect the interface circuit 111 formed on the first active layer ACL1 to the memory device 200. However, unlike as illustrated, the interface circuit 111 may also be formed on the second die DIE2, and the interconnection via IV may also be formed to contact the second active layer ACL2 of the second die DIE2.

The interconnection via IV may include Cu, copper tin (CuSn), copper magnesium (CuMg), copper nickel (CuNi), copper zinc (CuZn), copper palladium (CuPd), copper gold (CuAu), copper rhenium (CuRe), copper tungsten (CuW), W, or a W alloy, but is not limited thereto. The interconnection via IV may include one or more of Al, Au, beryllium (Be), bismuth (Bi), cobalt (Co), Cu, hafnium (Hf), indium (In), Mn, molybdenum (Mo), Ni, lead (Pb), Pd, platinum (Pt), rhodium (Rh), Re, Ru, Ta, tellurium (Te), Ti, W, Zn, and zirconium (Zr), and may include one or more than two stacked structures.

In the electronic device 10 according to the inventive concepts, the signal path DP connected to the SoC 100 and the memory device 200 may be formed to be directly connected to them via the interconnection via IV, without passing through the SoC package substrate SSUB. Accordingly, when a size of a wiring area for forming the signal path DP is reduced, and a length of the signal path DP is reduced, power consumption in the signal path DP may be reduced, and an occurrence possibility of electromagnetic interference (EMI) in the signal path DP may be reduced. In other words, characteristics of the electronic device 10 may be improved.

Figure 4A:
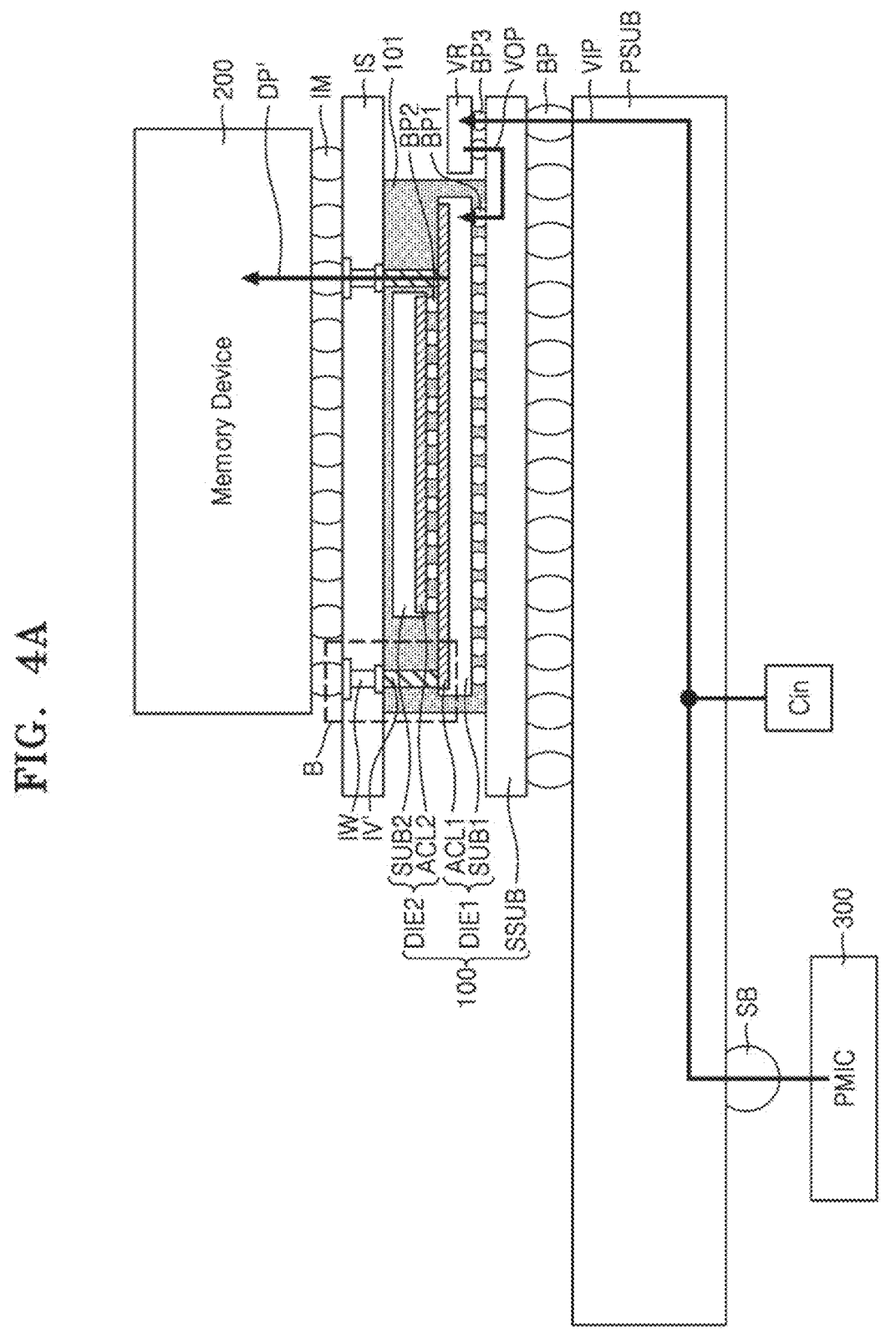
Figure 4B:
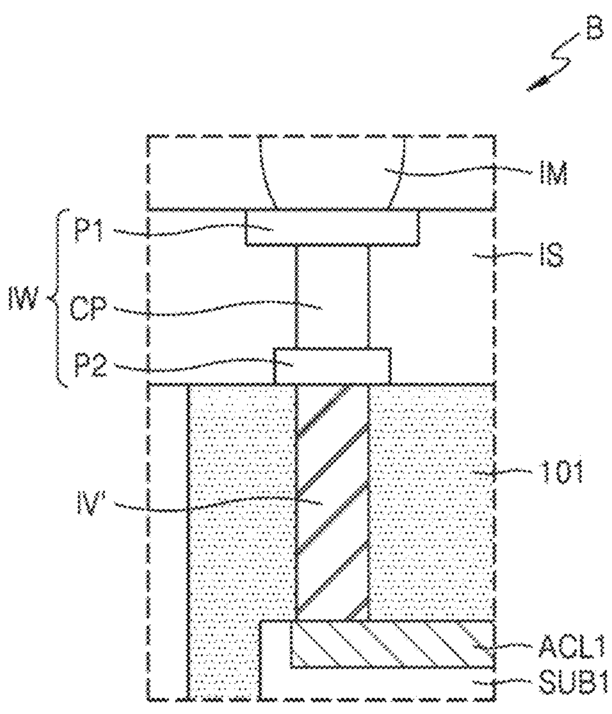
FIG. 4B is an enlarged cross-sectional view of a region B in FIG. 4A.

FIG. 4A is a cross-sectional view of an electronic device according to some example embodiments. FIG. 4B is an enlarged cross-sectional view of a region B in FIG. 4A. In the description with reference to FIG. 4A, duplicate descriptions of the same reference numerals as those in FIG. 3A are omitted.

Referring to FIGS. 4A and 4B, the SoC 100 may transmit at least one of a data input/output signal (for example, DQ in FIG. 1), control signals, and a clock to the memory device 200 via a signal path DP'. In addition, the SoC 100 may receive the data input/output signal DQ from the memory device 200 via the signal path DP'.

The signal path DP' may include an interconnection via IV' and an internal wiring IW of the interposer substrate IS. The interconnection via IV' may include the TMV penetrating the molding layer 101.

The internal wiring IW of the interposer substrate IS may include an upper pad P1, a lower pad P2, and a vertical internal wiring CP. The upper pad P1 of the interposer substrate IS may be connected to the interconnection terminal WI, and the lower pad P2 of the interposer substrate IS may be connected to the interconnection via IV'.

At least one wiring layer may be formed in the interposer substrate IS. The vertical internal wiring CP may extend in the vertical direction of the interposer substrate IS, for connecting the upper pad P1 to at least one wiring layer, or the lower pad P2 to at least one wiring layer. In addition, the vertical internal wiring CP may extend in the vertical direction for connecting different wirings to each other. In some example embodiments, the internal wiring IW of the signal path DP' may be formed on at least one wiring layer of the interposer substrate IS, and may further include a horizontal internal wiring extending in a horizontal direction of the interposer substrate IS.

In some example embodiments, the upper pad P1 and the lower pad P2 of the interposer substrate IS may include at least one of Cu, Ni, stainless steel, and BeCu. In some example embodiments, the vertical internal wiring CP or the horizontal internal wiring of the interposer substrate IS may include a metal such as Cu, Ni, Au, silver (Ag), aluminum (Al), W, Ti, Ta, In, Mo, Mn, Co, Sn, Mg, Re, Be, Ga, and Ru, or a combination thereof.

Figure 5:
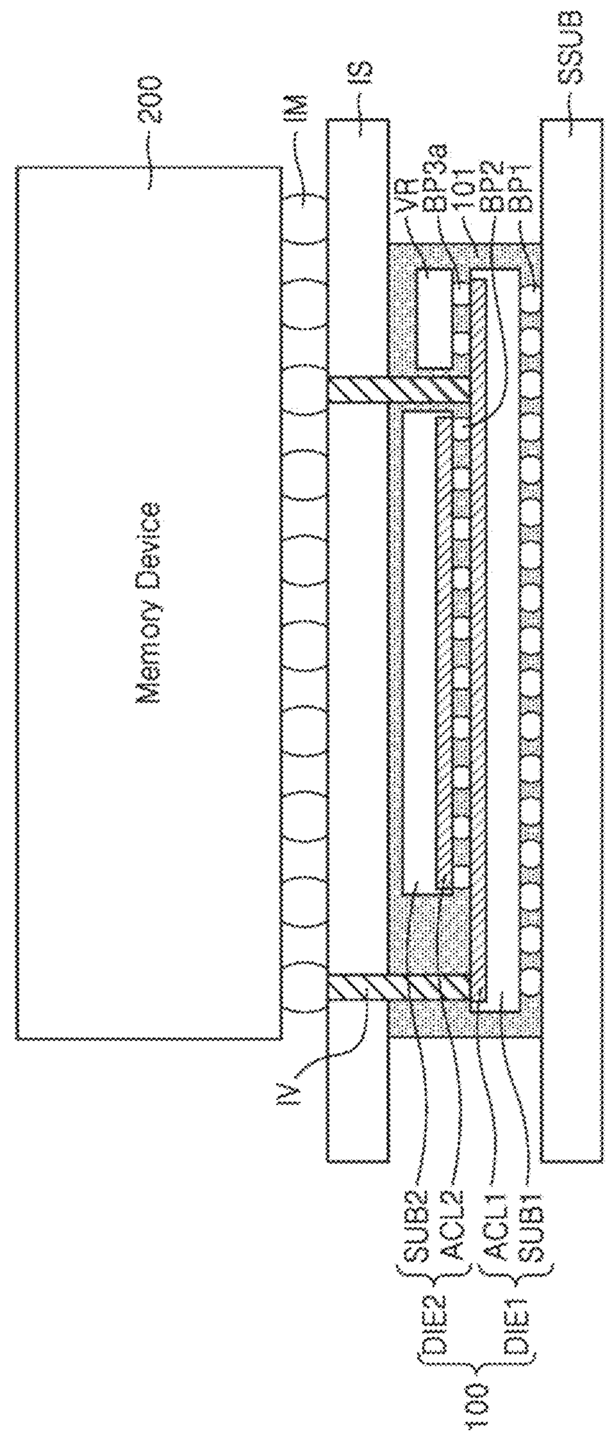
FIGS. 5 and 6 are cross-sectional views of electronic devices according to example embodiments.
Figure 6:
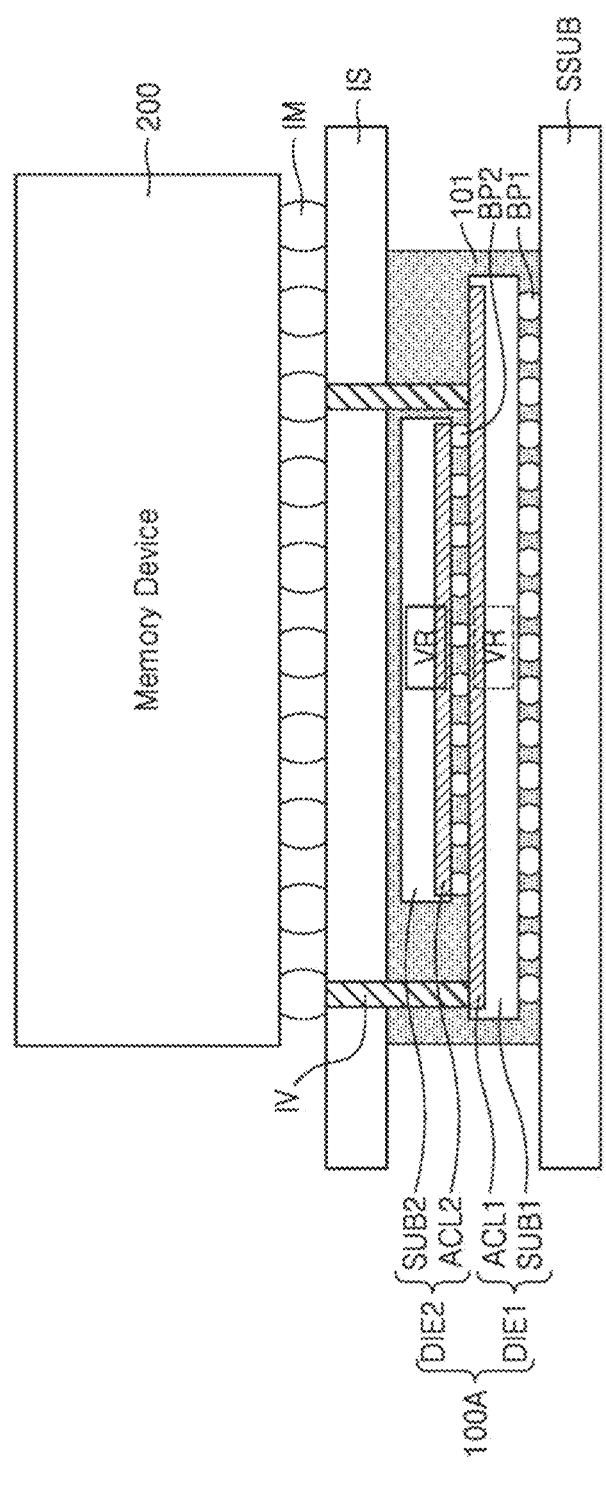

FIGS. 5 and 6 are cross-sectional views of electronic devices according to example embodiments. FIGS. 5 and 6 are detailed diagrams of SoCs, voltage regulators, and memory devices in electronic devices, and duplicate descriptions of the same reference numerals as those of FIG. 3A are omitted in the description given with reference to FIGS. 5 and 6. The SoCs 100 and 100A in FIGS. 5 and 6 may be mounted on a printed circuit board (PSUB in FIG. 3A) in the same manner as the SoC 100 in FIG. 3A, respectively.

Referring to FIG. 5, the voltage regulator VR may be arranged on the first die DIE1. In other words, the voltage regulator VR may be arranged in parallel with the second die DIE2 on the same flat surface. The voltage regulator VR may be electrically connected to the first die DIE1 via a third bump BP3*a* contacting the first die DIE1. Alternatively, unlike as illustrated in FIG. 5, the voltage regulator VR may be arranged in parallel with the second die DIE2, but may also be electrically connected to the SoC package substrate SSUB via a bump contacting the SoC package substrate SSUB.

Referring to FIG. 6, the SoC 100A may include the voltage regulator VR. For example, the voltage regulator VR may also be embedded in the first die DIE1 or the second die DIE2. Accordingly, the total length of the output voltage path VOP may be relatively further reduced.

Figure 7:
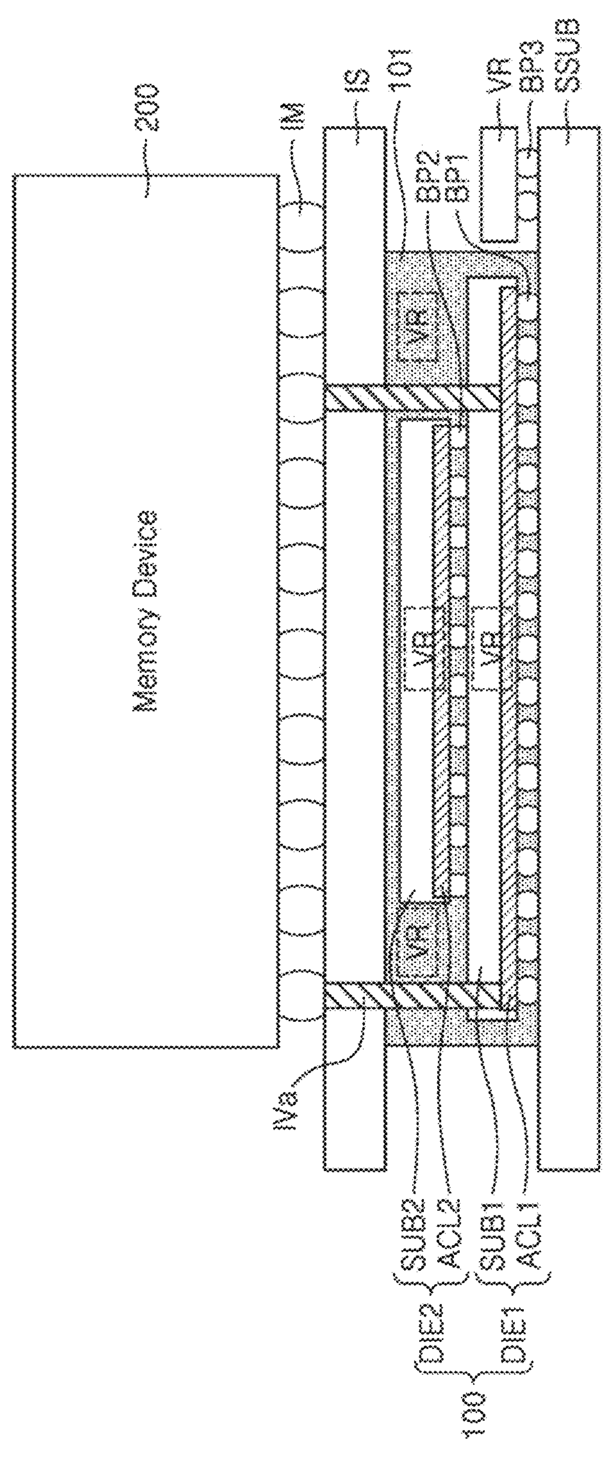
FIGS. 7 through 9 are cross-sectional views of electronic devices according to example embodiments.
Figure 8:
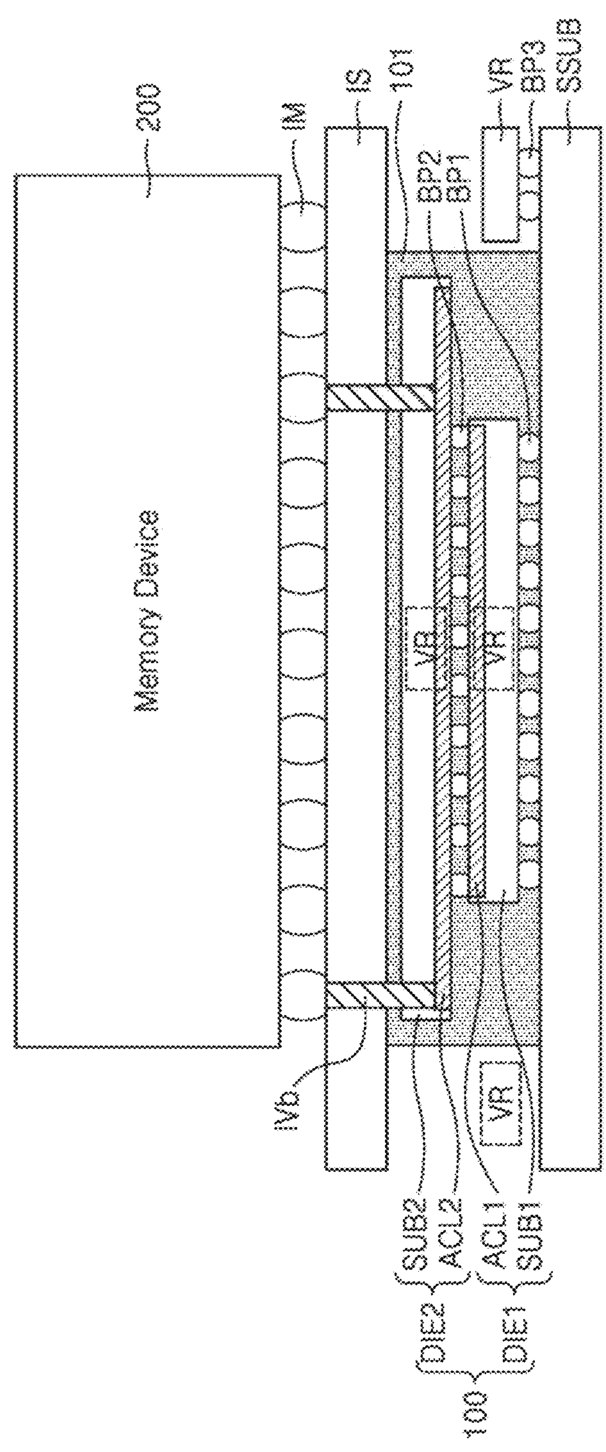
Figure 9:
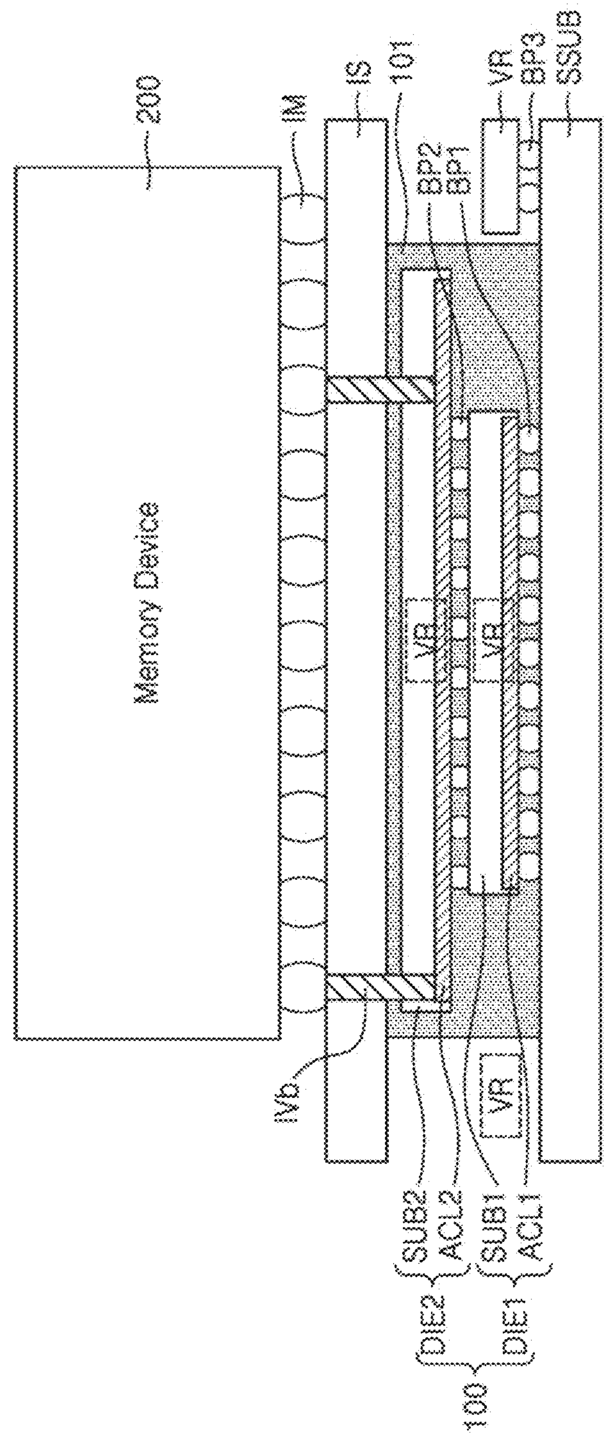

FIGS. 7 through 9 are cross-sectional views of electronic devices according to example embodiments. FIGS. 7 through 9 are detailed diagrams of SoCs, voltage regulators, and memory devices in electronic devices, and duplicate descriptions to be given with reference to FIGS. 7 and 9 of the same reference numerals to those in FIG. 3A are omitted. The SoCs 100 in FIGS. 7 through 9 may be mounted on a printed circuit board (PSUB in FIG. 3A) in the same manner as the SoC 100 in FIG. 3A.

Referring to FIG. 7, the first die DIE1 may include the first substrate SUB1 and the first active layer ACL1, and the second die DIE2 may include the second substrate SUB2 and the second active layer ACL2. The first active layer ACL1 of the first die DIE1 and the second active layer ACL2 of the second die DIE2 may be arranged face to back. For example, the first active layer ACL1 of the first die DIE1 may be arranged to face the SoC package substrate SSUB, and the second active layer ACL2 of the second die DIE2 may be arranged to face the first die DIE1.

The SoC 100 may transceive (transmit and/or receive) a data input/output signal (for example, DQ in FIG. 1) to and from the memory device 200 via an interconnection via IVa. In other words, a signal path (for example, DP in FIG. 1) may include the interconnection via IVa. The interconnection via IVa may include the TSV penetrating the interposer substrate IS, the TMV penetrating the molding layer 101, and the TSV penetrating the first substrate SUB1 of the first die DIE1. In some example embodiments, an interface circuit (for example, 111 in FIG. 1) included in a memory controller (for example, 110 in FIG. 1) of the SoC 100 may be formed on the first active layer ACL1 of the first die DIE1. The interconnection via IVa may be formed to extend from the first active layer ACL1 to the interconnection terminal IM in the vertical direction, for electrically connecting the interface circuit 111 formed on the first active layer ACL1 to the memory device 200. Alternatively, as described above with reference to FIGS. 4A and 4B, the signal path may also include an internal wiring inside the interposer substrate IS.

As described above with reference to FIGS. 3A, 5, and 6, the voltage regulator VR may also be mounted on the SoC package substrate SSUB, or on the first die DIE1, or may also be formed in at least one of the first die DIE1 and the second die DIE2.

Referring to FIG. 8, a size of the first die DIE1 arranged relatively closer to the SoC package substrate SSUB may be less than a size of the second die DIE2. The first active layer ACL1 of the first die DIE1 and the second active layer ACL2 of the second die DIE2 may be arranged face to face.

The SoC 100 may transceive the data input/output signal DQ to and from the memory device 200 via an interconnection via IVb. In other words, the signal path DP may include the interconnection via IVb, and the interconnection via IVb may include the TSV penetrating the interposer substrate IS, the TMV penetrating the molding layer 101, and the TSV penetrating the second substrate SUB2 of the second die DIE2. Alternatively, as described above with reference to FIGS. 4A and 4B, the signal path may also include an internal wiring inside the interposer substrate IS.

In some example embodiments, the interface circuit 111 included in the memory controller 110 of the SoC 100 may be formed on the second active layer ACL2 of the second die DIE2. The interconnection via IVb may be formed to extend from the second active layer ACL2 to the interconnection terminal IM in the vertical direction, for electrically connecting the interface circuit 111 formed on the second active layer ACL2 to the memory device 200. However, the example embodiments are not limited thereto, and the interface circuit 111 may also be formed on the first active layer ACL1 of the first die DIE1, and the signal path DP may also include wirings of each of the first active layer ACL1 and the second active layer ACL2, which are connected to the interconnection via IVb, and a second bump BP2. Alternatively, as described above with reference to FIGS. 4A and 4B, the signal path may also include the internal wiring inside the interposer substrate IS.

Referring to FIG. 9, a size of the first die DIE1 arranged relatively closer to the SoC package substrate SSUB may be less than a size of the second die DIE2. The first active layer ACL1 of the first die DIE1 and the second active layer ACL2 of the second die DIE2 may be arranged face to back. For example, the first active layer ACL1 of the first die DIE1 may be arranged to face the SoC package substrate SSUB, and the second active layer ACL2 of the second die DIE2 may be arranged to face the first die DIE1.

The SoC 100 may transceive the data input/output signal DQ to and from the memory device 200 via the interconnection via IVb. In other words, the signal path DP may include the interconnection via IVb. Alternatively, as described above with reference to FIGS. 4A and 4B, the signal path may also include the internal wiring inside the interposer substrate IS.

In some example embodiments, the interface circuit 111 included in the memory controller 110 of the SoC 100 may be formed on the second active layer ACL2 of the second die DIE2. The interconnection via IVb may be formed to extend from the second active layer ACL2 to the interconnection terminal IM in the vertical direction, for electrically connecting the interface circuit 111 formed on the second active layer ACL2 to the memory device 200. However, the example embodiments are not limited thereto, and the interface circuit 111 may also be formed on the first active layer ACL1 of the first die DIE1, and the signal path DP may also include wirings of each of the first active layer ACL1 and the second active layer ACL2, which are connected to the interconnection via IVb, the TSV penetrating the first substrate SUB1, and the second bump BP2.

Figure 10:
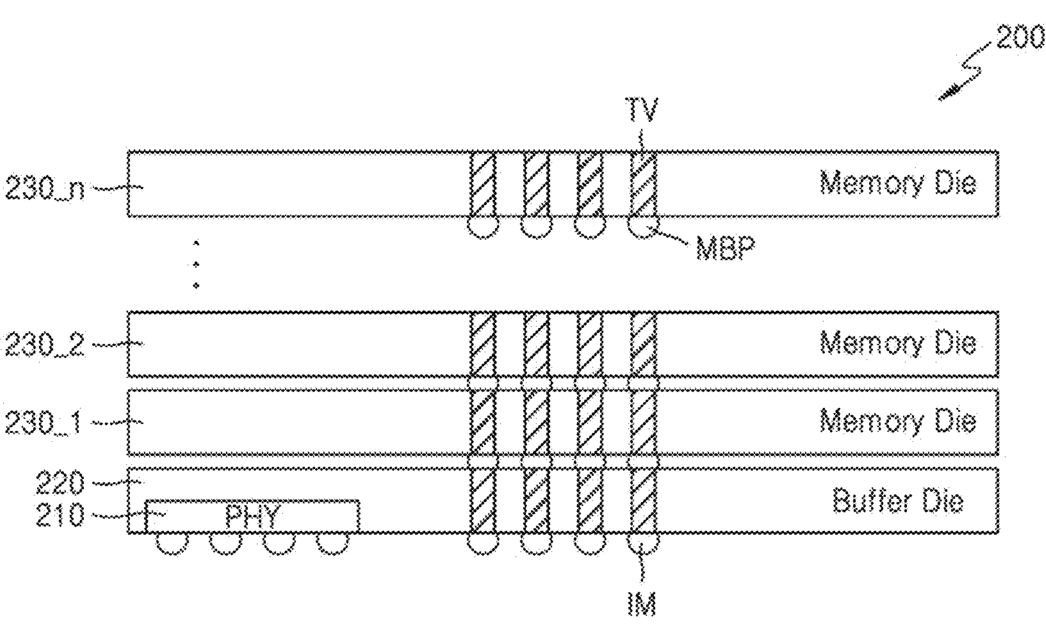
FIG. 10 is a cross-sectional view of a memory device included in an electronic device, according to some example embodiments.

FIG. 10 is a cross-sectional view of a memory device 200 included in an electronic device, according to some example embodiments.

Referring to FIG. 10, the memory device 200 may include a three-dimensional (3D) stacked memory device. The memory device 200 may include a buffer die 220, and a plurality of memory dies stacked on the buffer die 220, for example, first through $n^{th}$ memory dies 230_1 through **230_*n*. The n may include a natural number equal to or greater than 3, for example, 4 or 8, or may be variously changeable. The buffer die 220 and the first through $n^{th}$ memory dies 230_1 through 230_*n*** may be configured in one semiconductor package.

The memory device 200 may include through vias TV penetrating the buffer die 220 and the first through $n^{th}$ memory dies 230_1 through **230_*n*, and micro bumps MBP electrically connecting the through vias TV to each other. The through vias TV and the micro bumps MBP may provide electrical paths between the buffer die 220 and the first through $n^{th}$ memory dies 230_1 through 230_*n* in the memory device 200. The number of the through vias TV and the micro bumps MBP is not limited to as illustrated in FIG. 10, but may be variously changed. The $n^{th}$ memory die 230_*n*** may not include the through vias TV, but is not particularly limited thereto.

Each of the first through $n^{th}$ memory dies 230_1 through **230_*n* may include dynamic random access memory (RAM) (DRAM) chips. For example, each of the first through $n^{th}$ memory dies 230_1 through 230_*n* may include a general purpose DRAM device such as double data rate (DDR) synchronous DRAM (DDR SDRAM), a mobile DRAM device such as low power (LP) DDR (LPDDR) SDRAM, a graphics DRAM device such as graphics DDR (GDDR) synchronous graphics RAM (SGRAM), a wide input/output (I/O) providing a high capacity and a high bandwidth, a DRAM device such as high bandwidth memory (HBM), HBM2, HBM3, and a hybrid memory cube (HMC). However, the example embodiments are not limited thereto, and each of the first through $n^{th}$ memory dies 230_1 through 230_*n*** may also include a volatile memory device, which does not include a DRAM device, or may also include a non-volatile memory device.

According to some example embodiments, the first through $n^{th}$ memory dies 230_1 through **230_*n* may have substantially the same chip size. In other words, the first through $n^{th}$ memory dies 230_1 through 230_*n*** may have substantially the same planar shape and the same planar size.

The buffer die 220 may perform an interface operation of providing a data input/output signal, a command, an address, a chip select signal, or the like, which are received from a memory controller (for example, 110 in FIG. 1), to the first through $n^{th}$ memory dies 230_1 through **230_*n*, or of providing a data input/output signal, received from the first through $n^{th}$ memory dies 230_1 through 230_*n*, to the memory controller 110. The buffer die 220 may, for performing the interface operation, include a physical layer (PHY) 210, or an interface circuit. The PHY 210 may correspond to the interface circuit 210 in FIGS. 1 and 2**.

Figure 11:
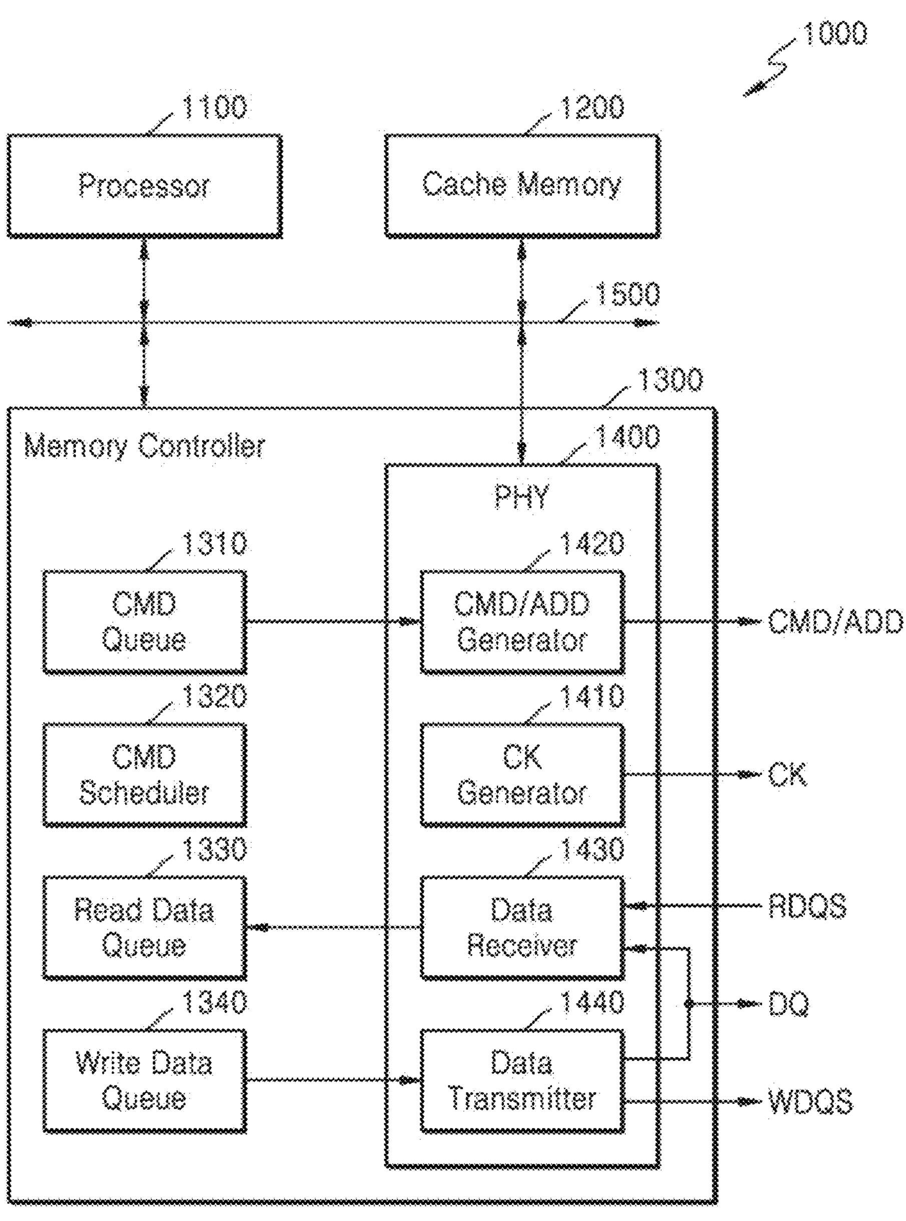
FIG. 11 is a block diagram of a system on chip included in an electronic device, according to some example embodiments.

FIG. 11 is a block diagram of an SoC 1000 included in an electronic device, according to some example embodiments.

Referring to FIG. 11, the SoC 1000 may correspond to above-described SoCs (for example, 100 in FIG. 1 and 100A in FIG. 2). The SoC 1000 may include the processor 1100, a cache memory 1200, a memory controller 1300, and a bus 1500. The bus 1500 may provide communication paths between the processor 1100, the cache memory 1200, and the memory controller 1300. The processor 1100 may execute various software (an application program, an operating system, a file system, a device driver, or the like), which is loaded on the cache memory 1200.

The processor 1100 may include multicores of the same type or multicores of different types. For example, the processor 1100 may include any one of a central processing unit (CPU), an image signal processing unit (ISP), a digital signal processing unit (DSP), a graphics processing unit (GPU), a vision processing unit (VPU), and a neural processing unit (NPU), and the number of the processor 1100 may be one or more.

In the cache memory 1200, an application program, an operating system, a file system, a device driver, or the like, for driving electronic devices (for example, 10 of FIG. 1 and 10A of FIG. 2) may be loaded. For example, the cache memory 1200 may include an SRAM device having a faster data input/output speed than a memory device (for example, 200 in FIG. 1).

The memory controller 1300 may access the memory device 200 in a direct memory access (DMA) method. The memory controller 1300 may include a command (CMD) queue 1310, a command (CMD) scheduler 1320, a read data queue 1330, a write data queue 1340, and a PHY 1400. The memory controller 1300 may correspond to the memory controller 110 in FIGS. 1 and 2, and the PHY 1400 may correspond to the interface circuit 111 in FIGS. 1 and 2. Components (1310 through 1340, and 1400) of the memory controller 1300 may be implemented by using a hardware method, a software method, or a combination thereof, in the SoC 1000.

The CMD queue 1310 may store commands and addresses, which are issued by the processor 1100 or generated according to a control of the processor 1100. The commands and the addresses stored in the CMD queue 1310 may be provided to the PHY 1400, based on a control of the CMD scheduler 1320.

The CMD scheduler 1320 may adjust a sequence of the commands and the addresses, that are stored in the CMD queue 1310, time points at which the commands and the addresses are input to the CMD queue 1310, time points at which the commands and the addresses are output by the CMD queue 1310, etc.

The read data queue 1330 may store read data transmitted by the memory device 200 via the PHY 1400 by using a read command. The read data stored in the read data queue 1330 may be provided to the cache memory 1200, and may be processed by the processor 1100.

The write data queue 1340 may store write data to be stored in the memory device 200. The write data stored in the write data queue 1340 by using a write command may be transmitted to the memory device 200 via the PHY 1400.

The PHY 1400 may include a clock (CK) generator 1410, a command/address (CMD/ADD) generator 1420, a data receiver 1430, and a data transmitter 1440. The CK generator 1410 may generate a clock CK to be output to the memory device 200, and the number of the clocks CK may correspond to the number of channels between the SoC 1000 and the memory device 200.

The CMD/ADD generator 1420 may receive the command CMD or the address ADD from the command queue 1310, and may transmit the command CMD or the address ADD to the memory device 200. The data receiver 1430 may receive the read data of the data input/output signal DQ, based on a read data strobe signal (RDQS or DQS) from the memory device 200. The data receiver 1430 may provide the received read data to the read data queue 1330. The data transmitter 1440 may receive the write data from the write data queue 1340. The data transmitter 1440 may transmit the received write data to the memory device 200, based on a write data strobe signal (WDQS or DQS). As described above, the data input/output signal DQ may be provided to the memory device 200 via a data path (for example, DP in FIG. 1).

Figure 12:
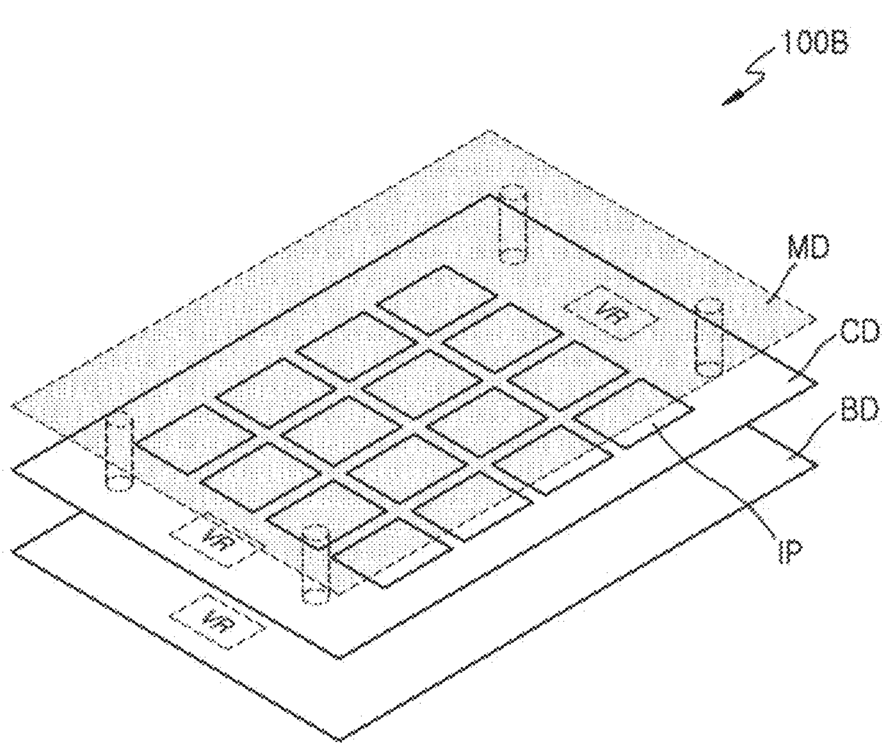
FIG. 12 is a diagram of a system on chip having a three-dimensional (3D) chiplet structure.

FIG. 12 is a diagram of an SoC 100B having a 3D chiplet structure.

Referring to FIG. 12, the SoC 100B may have the 3D chiplet structure including a base die BD, and a compute die CD stacked on the base die BD. A plurality of function blocks IP may be arranged on at least one of the base die BD and the compute die CD. In FIG. 12, the plurality of function blocks IP are illustrated as arranged on the compute die CD, but the example embodiments are not limited thereto, and the plurality of function blocks IP may also be arranged on the base die BD. In some example embodiments, the base die BD may correspond to the first die DIE1 in FIG. 3A, or the like, and the compute die CD may correspond to the second die DIE2 in FIG. 3A, etc.

In this case, each of the plurality of function blocks IP may include a chip designed to perform a designated particular function. For example, each of the plurality of function blocks IP may include a CPU chip, an input/output interface chip, a chip in which circuits for an artificial intelligence (AI) operation are implemented, a graphics chip, a media chip, etc. Some of the plurality of function blocks IP may include chips performing the same function.

In the SoC 100B according to the inventive concepts, it may be possible to variously modify types of the plurality of function blocks IP, which are arranged on the base die BD and the compute die CD according to the purpose of the SoC 100B. Accordingly, the SoC 100B may have improved reusability and expandability, compared to an SoC of a comparative example, in which the SoC is implemented as one function block.

The SoC 100B may include the voltage regulator VR, and the voltage regulator VR may be arranged on at least one of a plurality of dies included in the SoC 100B, that is, one of the base die BD and the compute die CD. The plurality of function blocks IP of the SoC 100B may receive an output voltage from the voltage regulator VR. Alternatively, in some example embodiments, the voltage regulator VR may be arranged outside the SoC 100B, and the SoC 100B may receive the output voltage from the voltage regulator VR in the outside.

A memory die MD may be arranged on the compute die CD of the SoC 100B. The memory die MD may correspond to the memory device 200 in FIG. 3A, etc. The memory die MD may be electrically connected to the SoC 100B via an interconnection via, and the interconnection via may constitute a signal path.

The electronic device 10 (or other circuitry, for example, SoC 100, voltage regulator VR, Memory Controller 110, Interface circuit 111, Memory Device 200, interface circuit 210, PMIC 300, variations thereof, SoC 1000, Processor 1100, cache memory 1200, memory controller 1300, subcomponents thereof, or other circuitry discussed herein) may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts has been particularly shown and described with reference to example embodiments thereof, it will be understood that various changes in form and details may be made therein without departing from the spirit and scope of the following claims.

What is claimed is:

1. An electronic device comprising:
a printed circuit board;
a system on chip (SoC) on the printed circuit board; and
a memory device on the SoC;
an interconnection via; and
an interposer substrate between the SoC and the memory device, electrically connecting the SoC to the memory device,
wherein the SoC comprises
a SoC package substrate;
a first die on the SoC package substrate, and having a logic circuit thereon; and
a second die on the first die, and having a logic circuit thereon,
wherein the interconnection via vertically extends in a direction from a contact location with the first die within the SoC to an external surface of the SoC facing the memory device penetrating the interposer substrate, the contact location being outside an outermost perimeter of the second die.

2. The electronic device of claim 1,
wherein the first die comprises a first substrate, and a first active layer on the first substrate and having a semiconductor element thereon,
the second die comprises a second substrate, and a second active layer on the second substrate and having a semiconductor element thereon, and
the first active layer and the second active layer are arranged face to face.

3. The electronic device of claim 1, wherein
the first die comprises a first substrate, and a first active layer on the first substrate and having a semiconductor element thereon,
the second die comprises a second substrate, and a second active layer on the second substrate and having a semiconductor element thereon,
the first active layer faces the SoC package substrate, and the second active layer faces the first die.

4. The electronic device of claim 1,
wherein a size of the first die is greater than a size of the second die.

5. The electronic device of claim 1,
wherein a size of the second die is greater than a size of the first die.

6. The electronic device of claim 1,
further comprising a voltage regulator configured to receive an input voltage and generate an output voltage to be used by the SoC,
wherein the voltage regulator is mounted on the SoC package substrate.

7. The electronic device of claim 6,
wherein the voltage regulator is in parallel with the first die on a same flat surface.

8. The electronic device of claim 1,
further comprising a voltage regulator configured to receive an input voltage and configured to generate an output voltage to be used by the SoC,
wherein the voltage regulator is on the first die.

9. The electronic device of claim 1,
further comprising a voltage regulator configured to receive an input voltage and generate an output voltage to be used by the SoC,
wherein the voltage regulator is embedded in one of the first die and the second die.

10. The electronic device of claim 1, wherein
the SoC comprises a memory controller configured to
transmit a data input/output signal to the memory device, and
receive the data input/output signal from the memory device, and
a signal path electrically connecting the memory controller to the memory device and configured to transmit the data input/output signal, the signal path comprising the interconnection via.

11. The electronic device of claim 1, wherein
the SoC comprises a memory controller configured to transmit a data input/output signal to the memory device, and receive the data input/output signal from the memory device, and
a signal path electrically connecting the memory controller to the memory device and configured to transmit the data input/output signal, the signal path comprising the interconnection via.

12. An electronic device comprising:
a printed circuit board;
a system on chip (SoC) on the printed circuit board, and comprising at least two logic die having a logic circuit thereon;
a memory device on the SoC;
an interposer substrate between the SoC and the memory device, and electrically connecting the SOC to the memory device; and
an interconnection via vertically extending in a direction from a contact location with one of the at least two logic die within the SoC to an external surface of the SoC facing the memory device to electrically connect the one of the at least two logic die to the memory device, penetrating the interposer substrate, the contact location being outside an outermost perimeter of another one of the at least two logic die.

13. The electronic device of claim 12, wherein
the at least two logic die comprises a plurality of vertically stacked logic dies, and
the interconnection via is vertically extending in a direction from a first die, which is lowermost of the plurality of vertically stacked logic dies, to the memory device.

14. The electronic device of claim 12, wherein
the at least two logic die comprises a plurality of vertically stacked logic dies, and
the interconnection via is vertically extending in a direction from a second die, which is uppermost of the plurality of vertically stacked logic dies, to the memory device.

15. The electronic device of claim 12,
wherein the SoC further comprises a molding layer surrounding the at least two logic die, and
the interconnection via comprises a through mold via penetrating the molding layer.

16. The electronic device of claim 12,
wherein the interconnection via comprises a through silicon via penetrating the interposer substrate.

17. The electronic device of claim 12,
further comprising a voltage regulator configured to receive an input voltage and generate an output voltage to be used by the SoC,
wherein the voltage regulator is mounted on a SoC package substrate of the SoC, and in parallel with the at least two logic die on a same flat surface.

18. The electronic device of claim 12, further comprising a voltage regulator configured to receive an input voltage and generate an output voltage to be used by the SoC, wherein the voltage regulator is embedded in the at least two logic die.

19. A system on chip (SoC) having a three-dimensional (3D) chiplet structure, the SoC comprising:

an SoC package substrate;

a first die on the SoC package substrate using a first bump, and having a first logic circuit thereon;

a second die on the first die, and having a second logic circuit thereon; and an interconnection via; and interposer substrate on an external surface of the SoC, and electrically connected to the SoC, wherein the first logic circuit and the second logic circuit receive an output voltage via an output voltage path, from a voltage regulator on the SoC package substrate, a plurality of function blocks are on at least one of the first die and the second die, and the interconnection via vertically extends in a direction from a contact location with the first die within the SoC to the external surface of the SoC opposite the SoC package substrate, penetrating the interposer substrate, the contact location being outside an outermost perimeter of the second die.

* * * * *